US012308299B2

United States Patent
Chiu et al.

(10) Patent No.: US 12,308,299 B2
(45) Date of Patent: May 20, 2025

(54) TEC-EMBEDDED DUMMY DIE TO COOL THE BOTTOM DIE EDGE HOTSPOT

(71) Applicant: Intel Corporation, Santa Clara, CA (US)

(72) Inventors: Chia-Pin Chiu, Tempe, AZ (US); Zhimin Wan, Chandler, AZ (US); Peng Li, Chandler, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/131,671

(22) Filed: Dec. 22, 2020

(65) Prior Publication Data

US 2022/0199482 A1    Jun. 23, 2022

(51) Int. Cl.
*H01L 23/367* (2006.01)
*H01L 23/40* (2006.01)
*H10N 10/17* (2023.01)
*H10N 10/80* (2023.01)

(52) U.S. Cl.
CPC ............ *H01L 23/367* (2013.01); *H01L 23/40* (2013.01)

(58) Field of Classification Search
None
See application file for complete search history.

(56) References Cited

U.S. PATENT DOCUMENTS

| | | | | |
|---|---|---|---|---|
| 2007/0000256 A1* | 1/2007 | Chau | ........................ | F25B 21/02 62/3.7 |
| 2013/0139524 A1* | 6/2013 | Kim | ........................ | F25B 21/02 62/3.7 |
| 2014/0029639 A1* | 1/2014 | Zarbock | ................ | G02B 6/4269 372/50.1 |
| 2014/0318588 A1* | 10/2014 | Kouma | ................... | H10N 10/01 136/200 |
| 2016/0155705 A1* | 6/2016 | Mahajan | ................ | H01L 21/568 438/107 |
| 2016/0286686 A1 | 9/2016 | Gambino | | |
| 2019/0214280 A1* | 7/2019 | Doany | ................. | H01L 25/0655 |
| 2020/0312741 A1* | 10/2020 | Wan | ......................... | H01L 23/38 |

FOREIGN PATENT DOCUMENTS

| | | |
|---|---|---|
| CN | 108 269 910 | 7/2018 |
| JP | H11 177152 A | 7/1999 |

OTHER PUBLICATIONS

Search Report from European Patent Application No. 21194501.9, mailed Apr. 5, 2022, 7 pgs.
Notice of Allowance from European Patent Application No. 21194501.9, mailed Apr. 4, 2025, 42 pgs.

* cited by examiner

*Primary Examiner* — Dale E Page
*Assistant Examiner* — Derek L Nielsen
(74) *Attorney, Agent, or Firm* — Schwabe, Williamson & Wyatt P.C.

(57) ABSTRACT

Embodiments disclosed herein include thermoelectric cooling (TEC) dies for multi-chip packages. In an embodiment, a TEC die comprises a glass substrate and an array of N-type semiconductor vias and P-type semiconductor vias through the glass substrate. In an embodiment, conductive traces are over the glass substrate, and individual ones of the conductive traces connect an individual one of the N-type semiconductor vias to an individual one of the P-type semiconductor vias.

25 Claims, 11 Drawing Sheets

US 12,308,299 B2

TEC-EMBEDDED DUMMY DIE TO COOL THE BOTTOM DIE EDGE HOTSPOT

TECHNICAL FIELD

Embodiments of the present disclosure relate to electronic packages, and more particularly multi-die packages with embedded thermoelectric cooling (TEC) dummy dies for improved thermal control.

BACKGROUND

Thermal management of microelectronic package architectures is becoming an extremely important design parameter as the package power and number of dies increase. In one particular package architecture, a base die is provided over a package substrate. A plurality of compute dies are provided over the base die. In some instances, the compute dies are embedded in a mold layer. The compute dies are thermally coupled to an integrated heat spreader (IHS). However, the edge of the base die is only covered by the mold material. The mold material is a low thermal conductivity material, and provides poor thermal coupling to the IHS. As such, the edges of the base die become hotspots that limit the package performance.

One way to decrease the temperature of the hotspot is to use a high thermal conductivity mold material. However, such materials will increase the cost of the package and are, therefore, not desirable. Alternatively, improved system cooling may be implemented, such as liquid cooling. This too increases the cost and complexity of the package. In yet another solution, the thickness of the compute dies may be decreased, which also decreases the thickness of the mold material. While this solution may result in a decrease in the temperature of the hotspot, the hotspot still remains.

EMBODIMENTS OF THE PRESENT DISCLOSURE

Described herein are multi-die packages with embedded thermoelectric cooling (TEC) dummy dies for improved thermal control, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
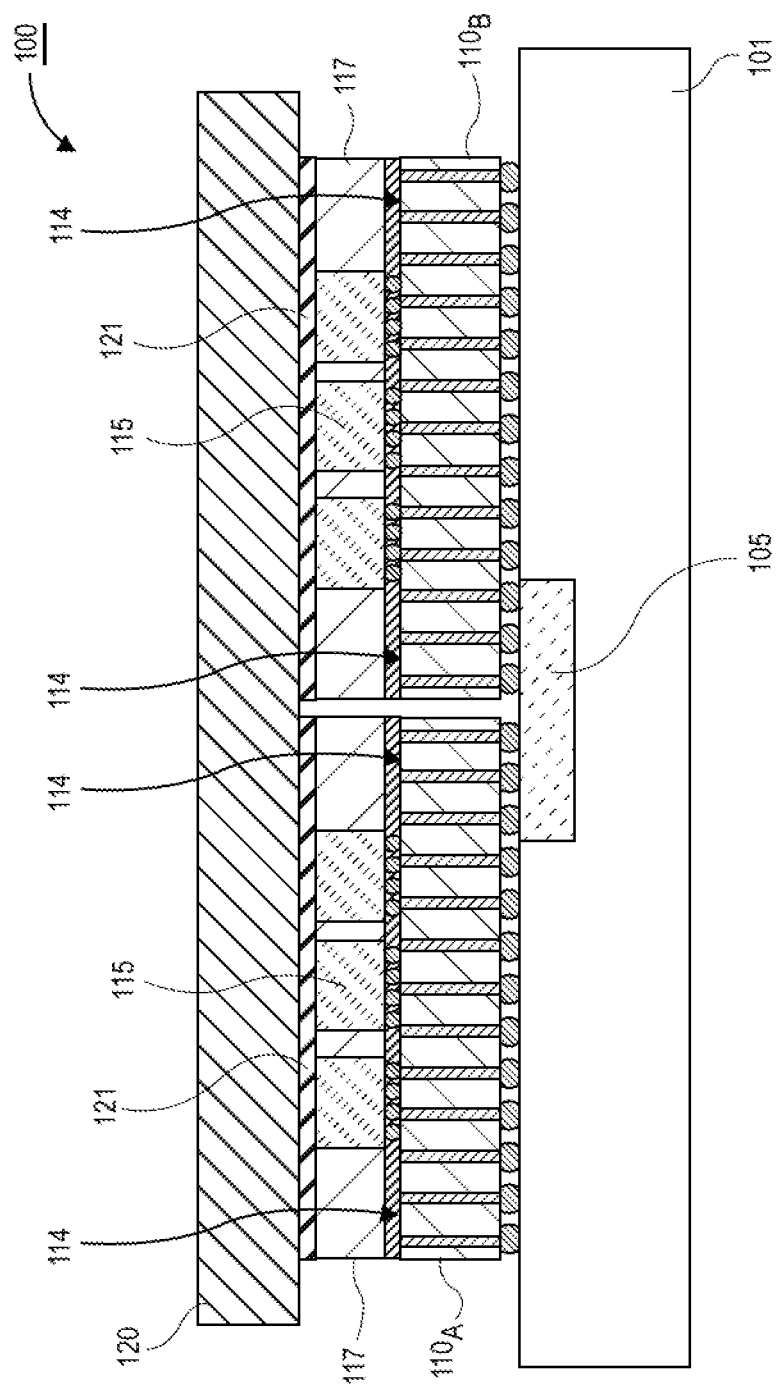
FIG. 1 is a cross-sectional illustration of an electronic package with hotspots along the edges of base dies, in accordance with an embodiment.

As noted above, thermal management is an increasingly important design parameter in advanced electronic package architectures. One such architecture is illustrated in FIG. 1. As shown, the electronic package 100 comprises a package substrate 101. A pair of base dies $110_A$ and $110_B$ are provided over the package substrate 101. An embedded bridge 105 in the package substrate 101 may provide high density routing between the first base die $110_A$ and the second base die $110_B$.

In some instances, a plurality of compute dies 115 are provided over each of the base dies 110. The compute dies 115 may be embedded in a mold layer 117. The top surface of the compute dies 115 are thermally coupled to an integrated heat spreader (IHS) 120 by a thermal interface material (TIM) 121. In such architectures, the central portions of the base dies $110_A$ and $110_B$ are thermally coupled to the IHS 120 through the compute dies 115. However, the edges 114 of the base dies $110_A$ and $110_B$ are thermally coupled to the IHS 120 through the mold layer 117. Since the mold layer 117 has a low thermal conductivity, the edges 114 of the base dies $110_A$ and $110_B$ cannot be adequately cooled and become hotspots. This negatively impacts the performance of the electronic package 100.

Accordingly, embodiments disclosed herein include thermoelectric cooler (TEC) dies that are provided over the edges of the base dies. The TEC dies allow for active cooling of the hotspots by transferring heat from the base dies on the cold side of the TEC die to the IHS on the hot side of the TEC die. In this manner, the hotspots are eliminated or significantly reduced.

In some implementations, a single TEC die may span between the two base dies. In other embodiments, each TEC die may be isolated to a single one of the base dies. In an embodiment, the TEC dies may be provided between the IHS and the base dies. In yet another embodiment, the TEC dies may fill recesses that are formed in the IHS. Furthermore, while TEC dies are illustrated as being integrated into electronic packages similar to the electronic package 100 in FIG. 1, it is to be appreciated that TEC dies may be utilized in many different packaging architectures. For example, a TEC die may be integrated into an electronic package with optical interconnects.

In an embodiment, the TEC dies may comprise a glass substrate with an array of semiconductor vias through the glass substrate. The semiconductor vias may comprise P-type and N-type semiconductors in an alternating pattern. The semiconductor vias may be electrically coupled to each other by conductive traces over a top surface and bottom surface of the glass substrate. In an embodiment, the connections may be made in a serpentine pattern. A heat spreader may also be provided over the top surface and the bottom surface of the glass substrate.

Figure 2A:
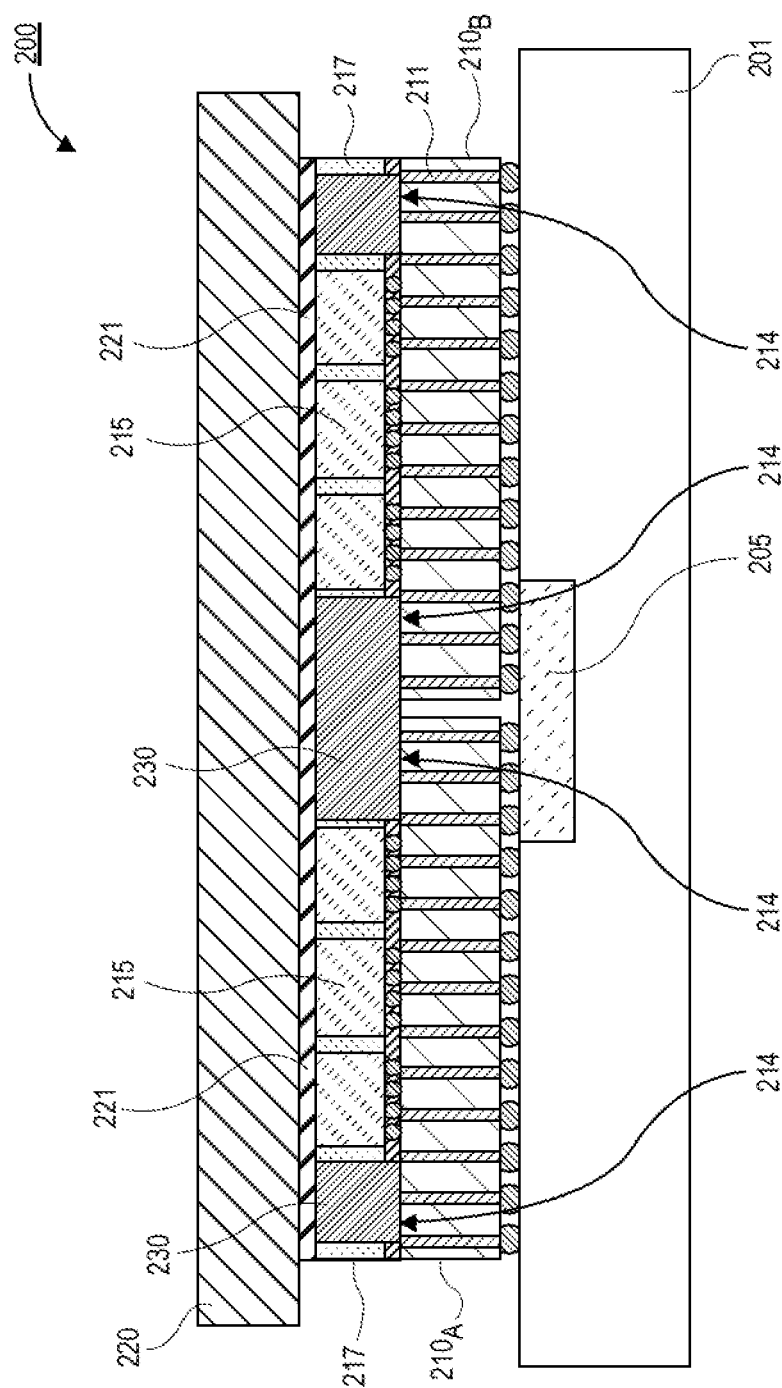
FIG. 2A is a cross-sectional illustration of an electronic package with thermoelectric cooler (TEC) dies over the edges of the base dies, in accordance with an embodiment.

Referring now to FIG. 2A, a cross-sectional illustration of an electronic package 200 is shown, in accordance with an embodiment. In an embodiment, the electronic package 200 comprises a package substrate 201. The package substrate 201 may comprise conductive routing (not shown), such as traces, vias, pads, and the like. The conductive routing may be on and/or embedded in dielectric layers.

In an embodiment, a first base die $210_A$ and a second base die $210_B$ may be provided over the package substrate 201. The first base die $210_A$ and the second base die $210_B$ may be coupled to the package substrate 201 by interconnects, such as solder balls or the like. In an embodiment, the first base die $210_A$ is communicatively coupled to the second base die $210_B$ by an embedded bridge 205 in the package substrate 201. The bridge 205 may provide high density routing between the first base die $210_A$ and the second base die $210_B$.

In an embodiment, the first base die $210_A$ and the second base die $210_B$ may comprise through substrate vias (TSVs) 211. The TSVs 211 electrically couple the front side surface of the base dies $210_A$ and $210_B$ to the backside surface of the base dies $210_A$ and $210_B$. In an embodiment, the first base die $210_A$ and the second base die $210_B$ may comprise a semiconductor material, such as silicon. In an embodiment, the base dies $210_A$ and $210_B$ may be passive devices. That is, the base dies $210_A$ and $210_B$ may only provide conductive routing and/or other passive features in some embodiments. In other embodiments, the base dies $210_A$ and $210_B$ may comprise active components (e.g., transistors and the like).

In an embodiment, the base dies $210_A$ and $210_B$ provide high density routing in order to communicatively couple a plurality of compute dies 215 together. In an embodiment, the compute dies 215 may be coupled to the base dies $210_A$ and $210_B$ by interconnects, such as first level interconnects (FLIs) or the like. As shown, an underfill may surround the interconnects. In an embodiment, the compute dies 215 may be any type of die. For example, the compute dies 215 may comprise processors, graphics processors, memories, field-programmable gate arrays (FPGAs), or the like. In the illustrated embodiment, three compute dies 215 are provided over each of the base dies $210_A$ and $210_B$. However, it is to be appreciated that one or more compute dies 215 may be provided over each base die 210. Additionally, while the first base die $210_A$ and the second base die $210_B$ each are coupled to the same number of compute dies 215, it is to be appreciated that a different number of compute dies 215 may be coupled to the first base die $210_A$ and the second base die $210_B$.

In an embodiment, the compute dies 215 may be embedded in a mold layer 217. The mold layer 217 may be an epoxy or the like. In some instances the mold layer 217 may comprise a low thermal conductivity material. As such, thermal energy propagation from the underlying base dies $210_A$ and $210_B$ to the overlying IHS 220 is limited, especially towards the edges 214 of the base dies $210_A$ and $210_B$ where there are no compute dies 215.

Accordingly, embodiments disclosed herein include TEC dies 230 that are positioned over the edges 214 of the base dies $210_A$ and $210_B$. In the illustrated embodiment, the TEC dies 230 are shown as generic blocks. A more detailed description of the structure of the TEC dies 230 and a process for fabricating the TEC dies 230 are provided below. In an embodiment, the TEC dies 230 comprise a cold surface (i.e., the bottom surface in FIG. 2A) over the base dies $210_A$ and $210_B$ and a hot surface (i.e., the top surface in FIG. 2A) that is thermally coupled to the IHS 220. The hot surface may be thermally coupled to the IHS 220 by a TIM 221. In a particular embodiment, the TIM 221 may be a solder based TIM (STIM).

In an embodiment, each of the TEC dies 230 may be located over one of the base dies $210_A$ and $210_B$. For example, the leftmost TEC die 230 is over only the first base die $210_A$, and the rightmost TEC die 230 is over only the second base die $210_B$. However, embodiments may also include a TEC die 230 (e.g., the middle TEC die 230) that is over both the first base die $210_A$ and the second base die $210_B$. That is, the middle TEC die 230 may span across a gap between the first base die $210_A$ and the second base die $210_B$ in order to provide thermal control of both base dies $210_A$ and $210_B$.

In an embodiment, the TEC dies 230 may pass through portions of the mold layers 217. In some instances, the TEC dies 230 are embedded in the mold layers 217. However, the TEC dies 230 may also be inserted into holes through the mold layers 217. That is, the TEC dies 230 may not be mechanically coupled to the mold layers 217 in some embodiments. In yet another embodiment, the mold layers 217 end proximate to outer edges of the compute dies 215, and the TEC dies 230 may be entirely outside of the mold layers 217.

In the illustrated embodiment, the top surface of the TEC dies 230 may be substantially coplanar with top surfaces of the compute dies 215. In such an embodiment, a single TIM 221 may span from a first edge of the first base die $210_A$ to a second edge of the second base die $210_B$. The TIM 221 may also cover portions of the mold layer 217.

Figure 2B:
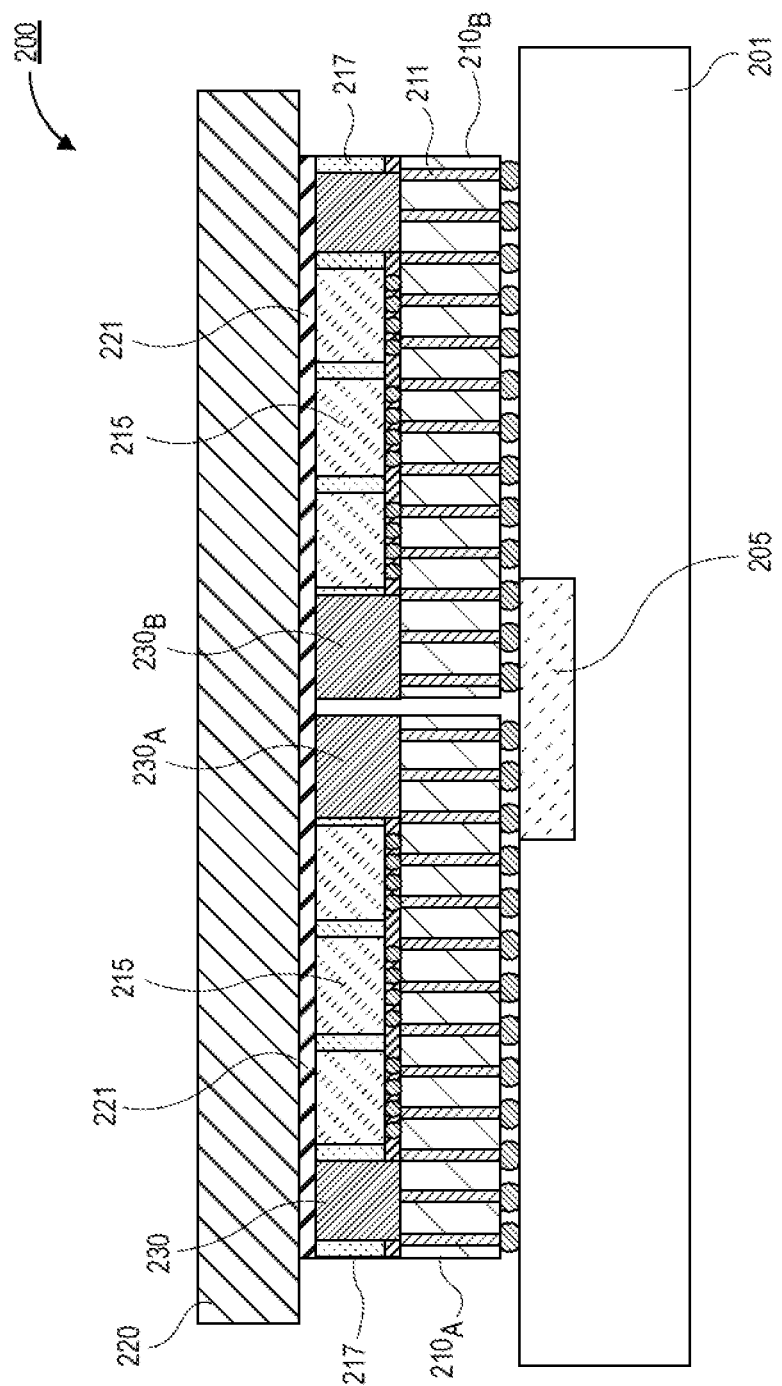
FIG. 2B is a cross-sectional illustration of an electronic package with TEC dies over the edges of the base dies, in accordance with an additional embodiment.

Referring now to FIG. 2B, a cross-sectional illustration of an electronic package 200 is shown, in accordance with an additional embodiment. The electronic package 200 in FIG. 2B may be substantially similar to the electronic package 200 in FIG. 2A, with the exception of the middle TEC dies 230. Whereas the middle TEC die 230 in FIG. 2A spans across the gap between the first base die $210_A$ and the second base die $210_B$, the embodiment shown in FIG. 2B includes separate TEC dies 230$_A$ and 230$_B$. The TEC die 230$_A$ is provided over an edge of the first base die 210$_A$, and the TEC die 230$_B$ is provided over the edge of the second base die 210$_B$. That is, in FIG. 2B each of the TEC dies 230 are provided over only a single one of the base dies 210$_A$ or 210$_B$.

Figure 2C:
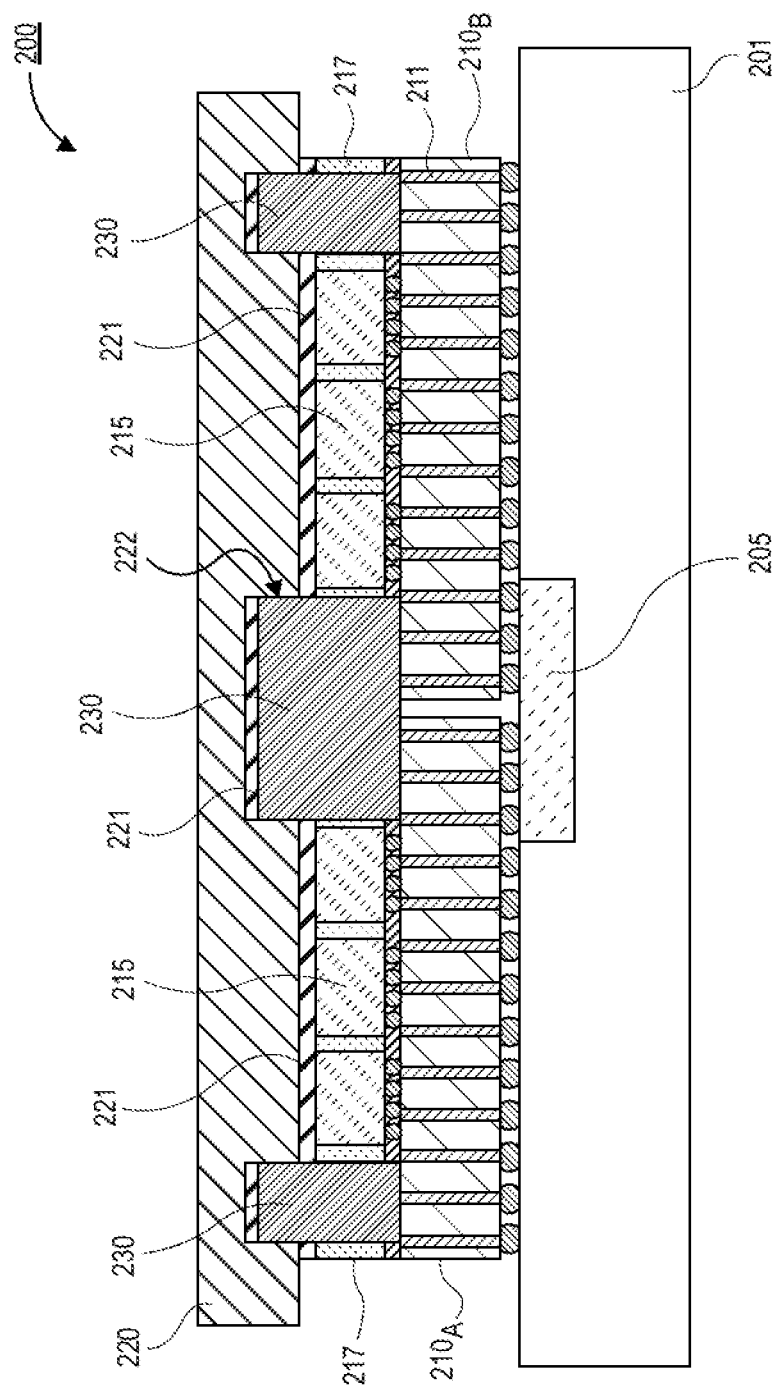
FIG. 2C is a cross-sectional illustration of an electronic package with TEC dies that extend into recesses in the integrated heat spreader (IHS), in accordance with an embodiment.

Referring now to FIG. 2C, a cross-sectional illustration of an electronic package 200 is shown, in accordance with an additional embodiment. The electronic package 200 in FIG. 2C may be substantially similar to the electronic package 200 in FIG. 2A, with the exception of the thickness of the TEC dies 230. Instead of having a top surface that is substantially coplanar with top surfaces of the compute dies 215, the TEC dies 230 may have top surfaces that are above the top surfaces of the compute dies 215. Such an embodiment may be used when the form factor of the TEC dies 230 differs from the form factor of the compute dies 215.

In an embodiment, the increased thickness of the TEC dies 230 may be accommodated by recesses 222 in the IHS 220. The TEC dies 230 fill at least a portion of the recesses 222 in some embodiments. In an embodiment, a TIM 221 is provided over a top surface of the TEC dies 230 to be thermally coupled to a surface of the recess 222 in the IHS 220. In an embodiment, the TIM 221 may be a STIM. Due to the recess 222, the TIM 221 over the TEC dies 230 may be disjointed from the TIM 221 over the compute dies 215.

In FIGS. 2A-2C, the electronic packages 200 are shown as having similar architectures with variations in the TEC dies. That is, each of the electronic packages 200 comprise base dies 210$_A$ and 210$_B$, with compute dies 215 over the base dies 210$_A$ and 210$_B$. However, it is to be appreciated that other electronic package architectures may also benefit from the inclusion of TEC dies. Particularly, TEC dies may be beneficial to any electronic package architecture where there is a high thermal resistance between a hotspot on a die and the IHS.

Figure 3:
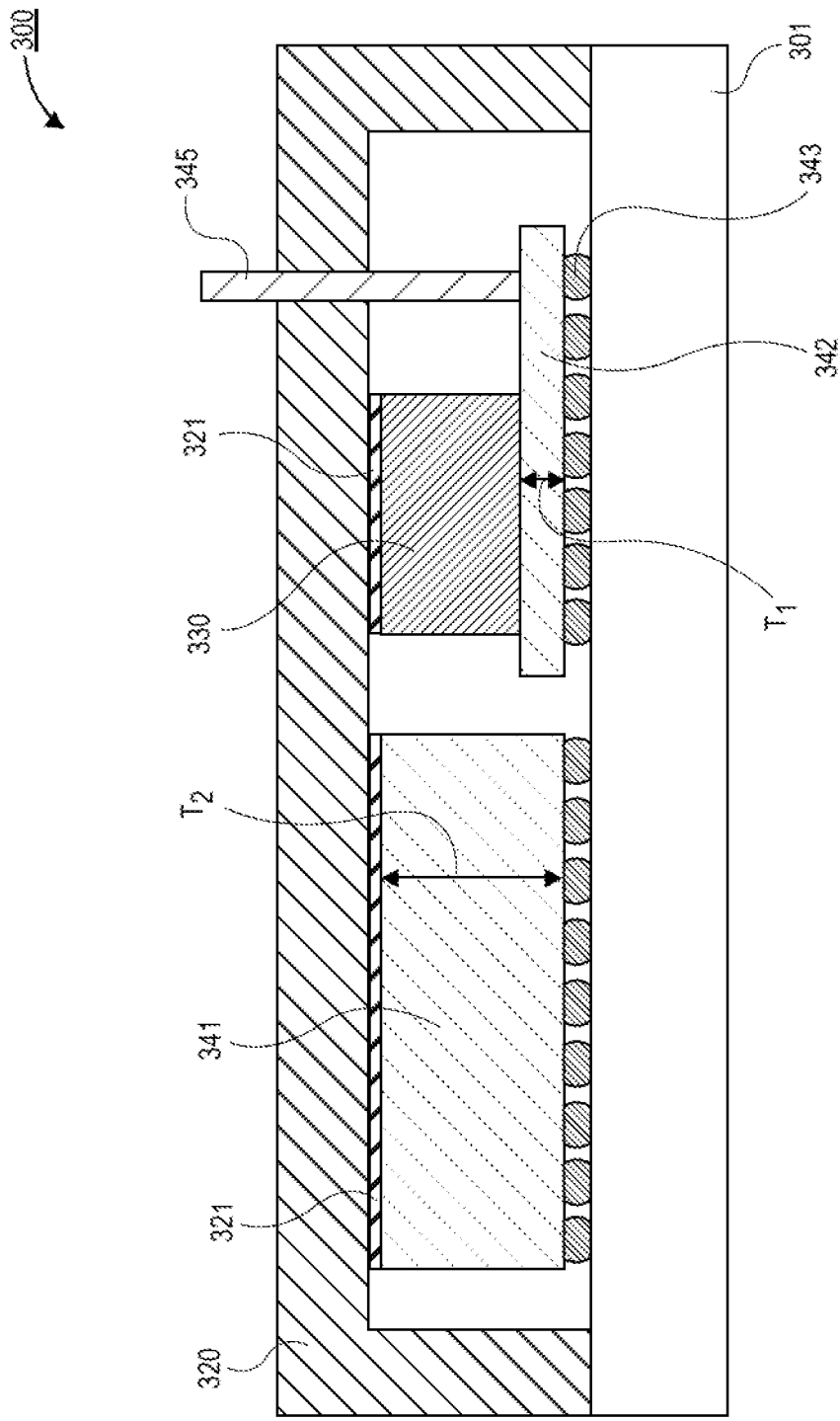
FIG. 3 is a cross-sectional illustration of an electronic package with optical interconnects and a TEC die over a photonics die, in accordance with an embodiment.

Referring now to FIG. 3, a cross-sectional illustration of an electronic package 300 is shown, in accordance with an embodiment. In an embodiment, the electronic package 300 may be an optical system. For example, an optical interconnect 345 may be coupled to a photonics die 342. In the illustrated embodiment, the optical interconnect 345 may pass through the IHS 320.

In an embodiment, the electronic package 300 comprises a package substrate 301. The photonics die 342 and a second die 341 are coupled to the package substrate 301 by interconnects 343. In an embodiment, the photonics die 342 converts a signal between the optical and electrical regimes. The optical signal is propagated along (or received from) the optical interconnect 345, and the electrical signal is delivered to (or received from) the second die 341. The photonics die 342 and the second die 341 may be communicatively coupled by conductive routing in the package substrate 301 or by a bridge (not shown) embedded in the package substrate 301.

As shown, the photonics die 342 and the second die 341 may have different thicknesses. For example, the photonics die 342 has a first thickness $T_1$, and the second die 341 has a second thickness $T_2$ that is greater than the first thickness $T_1$. Due to the different thicknesses, the IHS 320 is only able to be thermally coupled to the second die 341. The IHS 320 may be thermally coupled to the second die 341 by a TIM 321, such as a STIM.

Not coupling the photonics die 342 to the IHS 320 is particularly problematic. This is because photonics dies utilize lasers to generate the optical signal. Lasers are particularly susceptible to reductions in efficiencies at elevated temperatures. Without thermal control of the photonics die 342, the efficiency and reliability of the electronic package 300 are significantly reduced.

Accordingly, embodiments may comprise a TEC die 330 that is provided over the photonics die 342. The TEC die 330 and a TIM 321 (e.g., an STIM) may thermally couple the photonics die 342 to the IHS 320. Particularly, a cold surface of the TEC die 330 is provided on the photonics die 342, and the hot surface of the TEC die 330 is thermally coupled to the IHS 320 by the TIM 321.

Figure 4A:
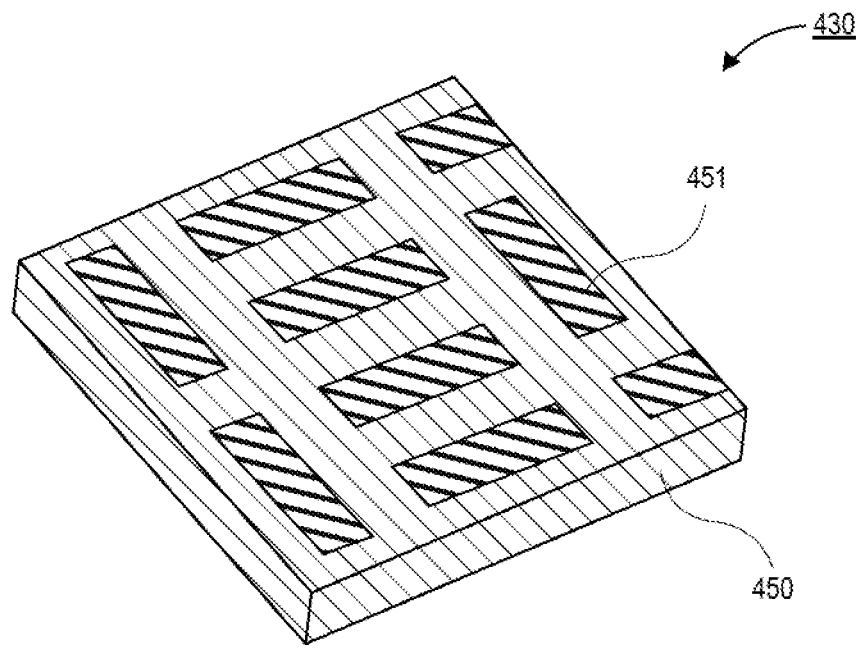
FIG. 4A is a perspective view illustration of a TEC die, in accordance with an embodiment.
Figure 4B:
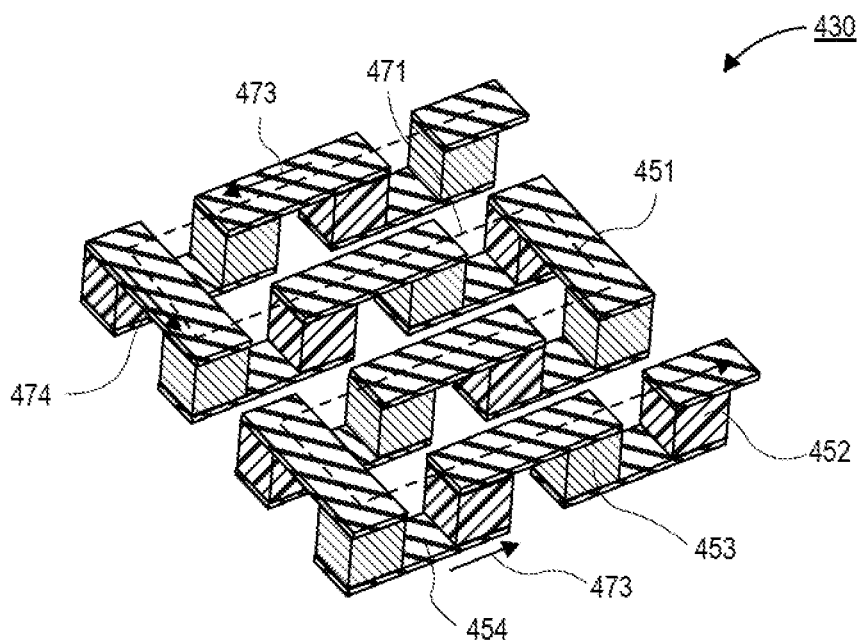
FIG. 4B is a perspective view illustration of a TEC die with the glass substrate removed to show the P-type semiconductor vias and the N-type semiconductor vias, in accordance with an embodiment.
Figure 4C:
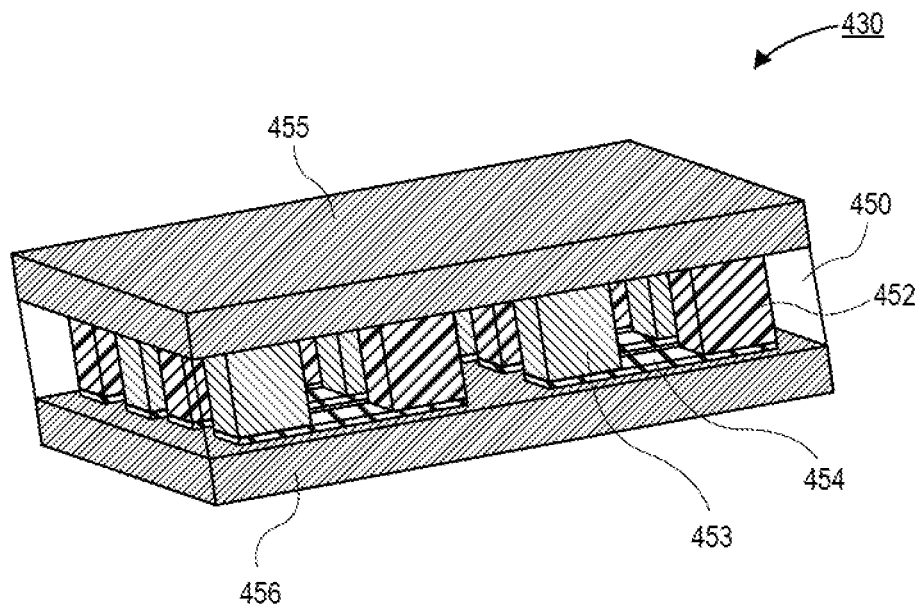
FIG. 4C is a perspective view illustration of a TEC die with heat spreaders over a top surface and a bottom surface of the glass substrate, in accordance with an embodiment.

Referring now to FIGS. 4A-4C, perspective view illustrations of TEC dies 430 shown in various views are shown, in accordance with an embodiment. The TEC dies 430 may be used in any of the electronic packages 200/300 described above.

Referring now to FIG. 4A, a perspective view illustration of a TEC die 430 is shown, in accordance with an embodiment. In the view illustrated, a glass substrate 450 is shown. The use of a glass substrate allows for a reduction in thermal leakage from the hot side (e.g., the top surface) back to the cold side (e.g., the bottom surface). This is due to the low thermal conductivity typically present in many glass materials. While a glass substrate is shown and described, it is to be appreciated that the TEC die 430 may utilize various other substrates with low thermal conductivities. In an embodiment, the glass substrate 450 may have a thickness between approximately 0.1 mm and approximately 5.0 mm. The footprint of the glass substrate 450 may be any size to accommodate the desired cooling capacity and/or dimensional constraints of the electronic package. In a particular embodiment, the footprint of the glass substrate 450 may be between approximately 1.0 mm$^2$ and approximately 100 mm$^2$.

Also shown in FIG. 4A are the conductive traces 451. The conductive traces 451 may comprise copper or the like. In an embodiment, the conductive traces 451 provide electrical coupling between the semiconductor vias (not visible in FIG. 4A). As will be described in greater detail below, the conductive traces 451 may be recessed into a surface of the glass substrate 450 so that a top surface of the conductive traces 451 are substantially coplanar with a top surface of the glass substrate 450. It is to be appreciated that conductive trace 451 are also provided over the bottom surface of the glass substrate 450, and are not visible in FIG. 4A.

Referring now to FIG. 4B, a perspective view illustration of a TEC die 430 with the glass substrate 450 removed is shown, in accordance with an embodiment. As shown, an array of semiconductor vias 452/453 are provided through a thickness of the glass substrate (not shown). Semiconductor vias 452 may be a first conductivity type, and semiconductor vias 453 may be a second conductivity type. For example, semiconductor vias 452 may be P-type semiconductors, and semiconductor vias 453 may be N-type semiconductors. In a particular embodiment, the P-type semiconductor vias 452 may comprise antimony and tellurium (e.g., $Sb_2Te_3$), and the N-type semiconductor vias 453 may comprise bismuth and tellurium (e.g., $Bi_2Te_3$).

The semiconductor vias 452/453 are arranged in an alternating pattern. The alternating pattern allows for P-type semiconductor vias 452 to be connected to neighboring N-type semiconductor vias 453 by the conductive traces 451 (i.e., the traces on the top surface) and conductive traces 454 (i.e., the traces on the bottom surface). In an embodiment, the path 471 of the conductive traces 451/454 may form a substantially serpentine pattern through the array. Though it is to be appreciated that other paths may also be used to connect the semiconductor vias 452/453 in series with each other. In an embodiment, the conductive traces 451 on the top surface may extend in a first length direction 473 and a second length direction 474 that is substantially orthogonal to the first length direction 473. In an embodiment, the conductive traces 454 on the bottom surface may all extend in the first direction 473. However, it is to be appreciated that variations in the layout of the array of semiconductor vias 452/453 may result in conductive traces extending in different directions than those shown in FIG. 4B.

In an embodiment, the array of semiconductor vias 452/453 may have any number of semiconductor vias 452/453. In the illustrated embodiment, the array is a four-by-four array to provide a total of sixteen semiconductor vias 452/453. However, the array may have a number of columns and a number of rows that are not equal. For example, the array may be a two-by-four array in some embodiments. Additionally, while shown as having a grid-like array in FIG. 4B, embodiments are not limited to an array that is defined by columns and rows. In an embodiment, the individual semiconductor vias 452/453 may have a footprint between approximately 0.01 mm$^2$ and approximately 1.0 mm$^2$.

Referring now to FIG. 4C, a perspective view illustration of a TEC die 430 with heat spreaders 455/456 is shown, in accordance with an embodiment. In FIG. 4C, the glass substrate 450 is shown as clear in order to not obscure the semiconductor vias 452/453 and conductive traces 454. The top surface conductive traces 451 are obscured by the top heat spreader 455 and are not visible in FIG. 4C.

It is to be appreciated that since the glass substrate 450 has a low thermal conductivity, that lateral spreading of thermal energy is limited. Accordingly, heat spreaders 455/456 are added in order to more evenly distribute the thermal energy. In an embodiment, the heat spreaders 455/456 may be in direct contact with the glass substrate 450 and the conductive traces 454/451. As such, thermal energy propagating through the semiconductor vias 452/453 can be more readily spread. In an embodiment, the heat spreaders 455/456 may have a thickness between approximately 0.1 mm and approximately 1.0 mm. It is to be appreciated that the heat spreaders 455 and 456 are not electrically conductive materials. If the heat spreaders were conductive, the conductive traces 454/451 would be shorted together. In a particular embodiment, the heat spreaders 455 and 456 comprise silicon.

Referring now to FIGS. 5A-5E, a series of perspective view illustrations depicting a process for fabricating a TEC die 530 is shown in accordance with an embodiment.

Figure 5A:
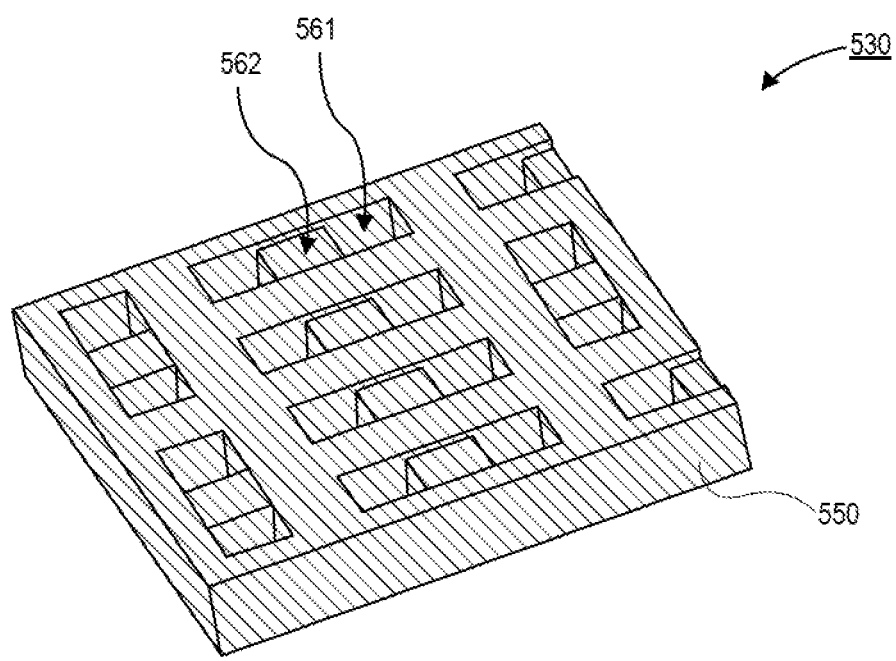
FIG. 5A is a perspective view illustration of a glass substrate with an array of via openings, in accordance with an embodiment.

Referring now to FIG. 5A, a perspective view illustration of a patterned glass substrate 550 is shown, in accordance with an embodiment. In an embodiment, the glass substrate 550 may be patterned to provide a plurality of via openings 561. The via openings 561 may pass through an entire thickness of the glass substrate 550. The via openings 561 are provided at locations where the semiconductor vias are desired. In an embodiment, trenches 562 may also be patterned into the surfaces of the glass substrate 550. The trenches 562 may connect neighboring via openings 561 together. The trenches allow for the subsequently deposited conductive traces to be recessed so that top surfaces of the conductive traces are substantially coplanar with the top surface of the glass substrate. In an embodiment, trenches 562 may also be provided on the bottom surface of the glass substrate (not shown). In an embodiment, the via openings 561 and the trenches 562 may be formed with any suitable patterning process. In a particular embodiment, the patterning process is a laser patterning process.

Figure 5B:
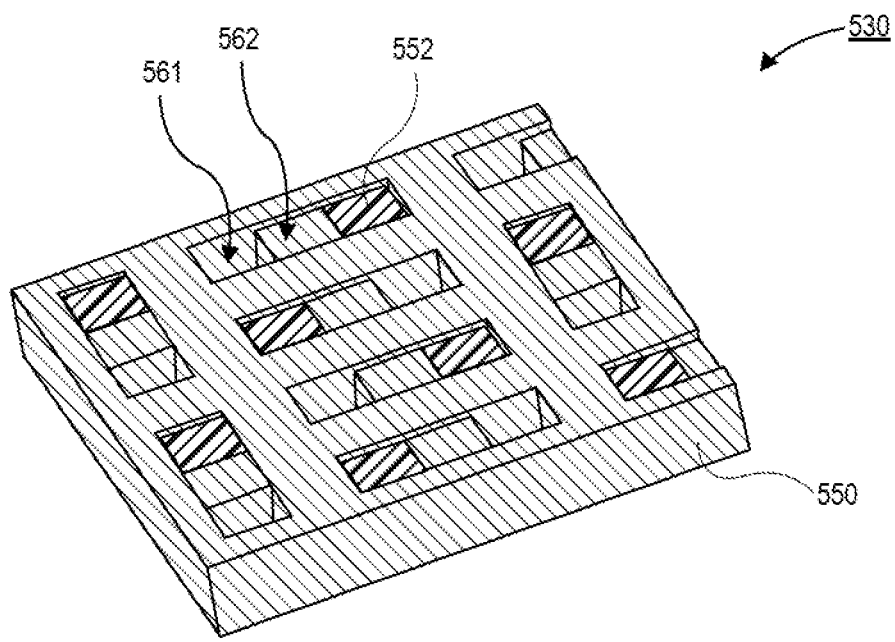
FIG. 5B is a perspective view illustration of the glass substrate after P-type semiconductor vias are disposed in some of the via openings, in accordance with an embodiment.

Referring now to FIG. 5B, a perspective view illustration of the TEC die 530 after P-type semiconductor vias 552 are disposed into the a first set of via openings 561 is shown, in accordance with an embodiment. The P-type semiconductor vias 552 may be deposited with any suitable deposition process. For example, a printing process, a sputtering process, or any other suitable deposition process may be used. During deposition of the P-type semiconductor vias 552, the via openings 561 for the N-type semiconductor vias and the trenches 562 are blocked (e.g., with a mask). The P-type semiconductor vias 552 may comprise any suitable P-type semiconductor material, such as, but not limited to, $Sb_2Te_3$.

Figure 5C:
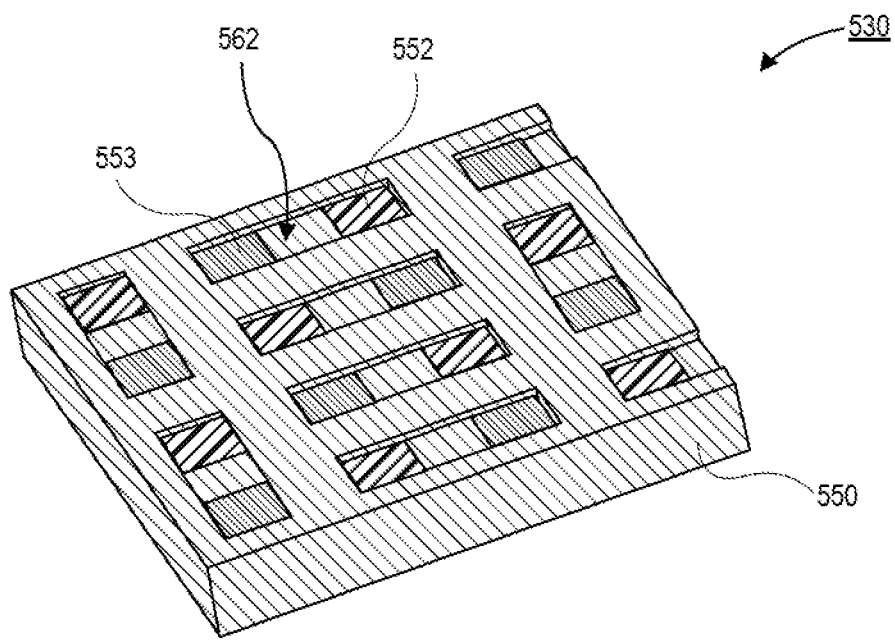
FIG. 5C is a perspective view illustration of the glass substrate after N-type semiconductor vias are disposed in the remainder of the via openings, in accordance with an embodiment.

Referring now to FIG. 5C, a perspective view illustration of the TEC die 530 after N-type semiconductor vias 553 are disposed into the remainder of the via openings 561 is shown, in accordance with an embodiment. The N-type semiconductor vias 553 may be deposited with any suitable deposition process. For example, a printing process, a sputtering process, or any other suitable deposition process may be used. During deposition of the N-type semiconductor vias 553, the trenches 562 and the P-type semiconductor vias 552 are blocked (e.g., with mask). The N-type semiconductor vias 553 may comprise any suitable N-type semiconductor material, such as, but not limited to, $Bi_2Te_3$.

Figure 5D:
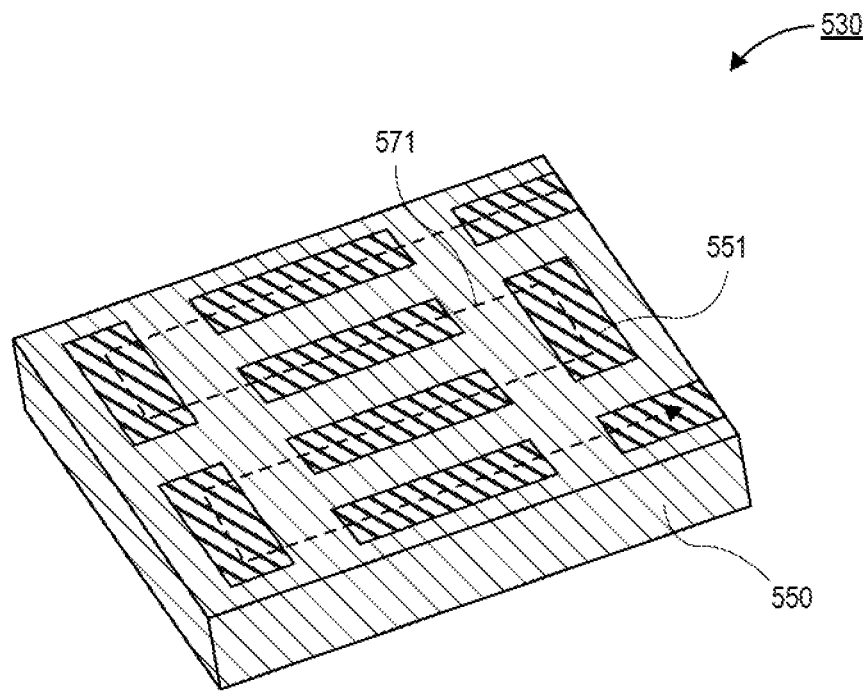
FIG. 5D is a perspective view illustration of the glass substrate after conductive traces are formed to connect the P-type semiconductor vias to the N-type semiconductor vias, in accordance with an embodiment.

Referring now to FIG. 5D, a perspective view illustration of the TEC die 530 after conductive traces 551 are disposed in the trenches 562 and over the P-type semiconductor vias 552 and the N-type semiconductor vias 553 is shown, in accordance with an embodiment. The conductive material (e.g., copper) of the conductive traces 551 may be deposited with a plating process. In an embodiment, any overburden may be removed with a polishing process to provide electrically isolated conductive traces 551 in the trenches 562. Furthermore, the top surface of the conductive traces 551 may be substantially coplanar with the top surface of the glass substrate 550. Additionally, conductive traces may also be formed in trenches on the bottom surface of the glass substrate. As such, the individual P-type semiconductor vias 552 and N-type semiconductor vias 553 may be electrically connected in series by the conductive traces 551 above and below the glass substrate 550. As shown, in FIG. 5D, the path 571 of the conductive traces 551 (both top and bottom) may form a substantially serpentine pattern through the array.

Figure 5E:
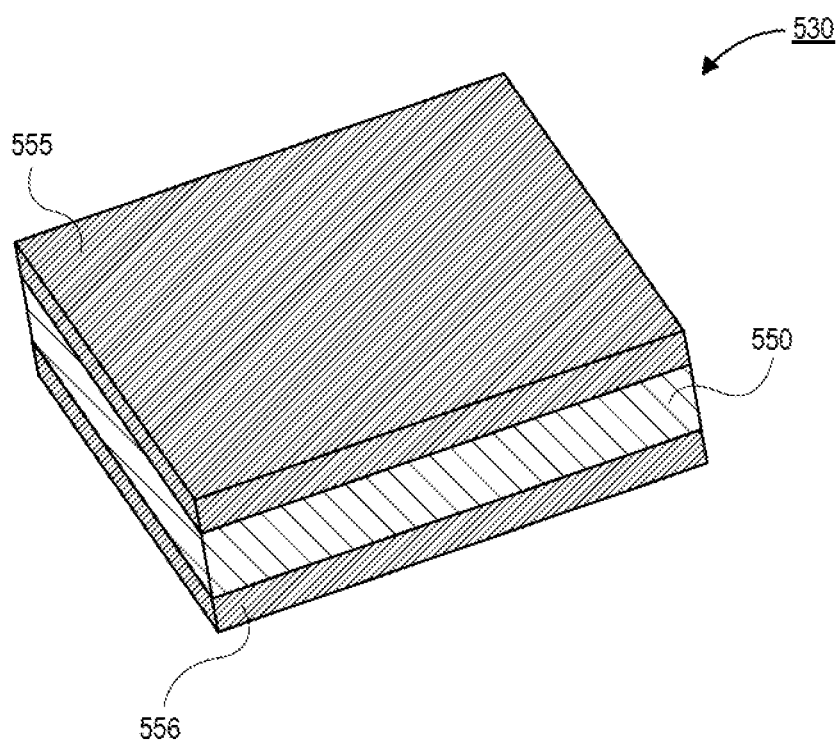
FIG. 5E is a perspective view illustration of the glass substrate after heat spreaders are provided above and below the glass substrate, in accordance with an embodiment.

Referring now to FIG. 5E, a perspective view illustration of the TEC die 530 after heat spreaders 555 and 556 are attached above and below the glass substrate 550 is shown, in accordance with an embodiment. In an embodiment, the heat spreaders 555 and 556 may be thermally conductive (but not electrically conductive) materials, such as, but not limited to, silicon. The heat spreaders 555 and 556 allow for thermal energy to more easily spread across the entire footprint of the TEC die 530. In an embodiment, the heat spreaders 555 may be bonded to the glass substrate 550 with an adhesive or other bonding mechanism, such as anodic bonding.

Figure 6:
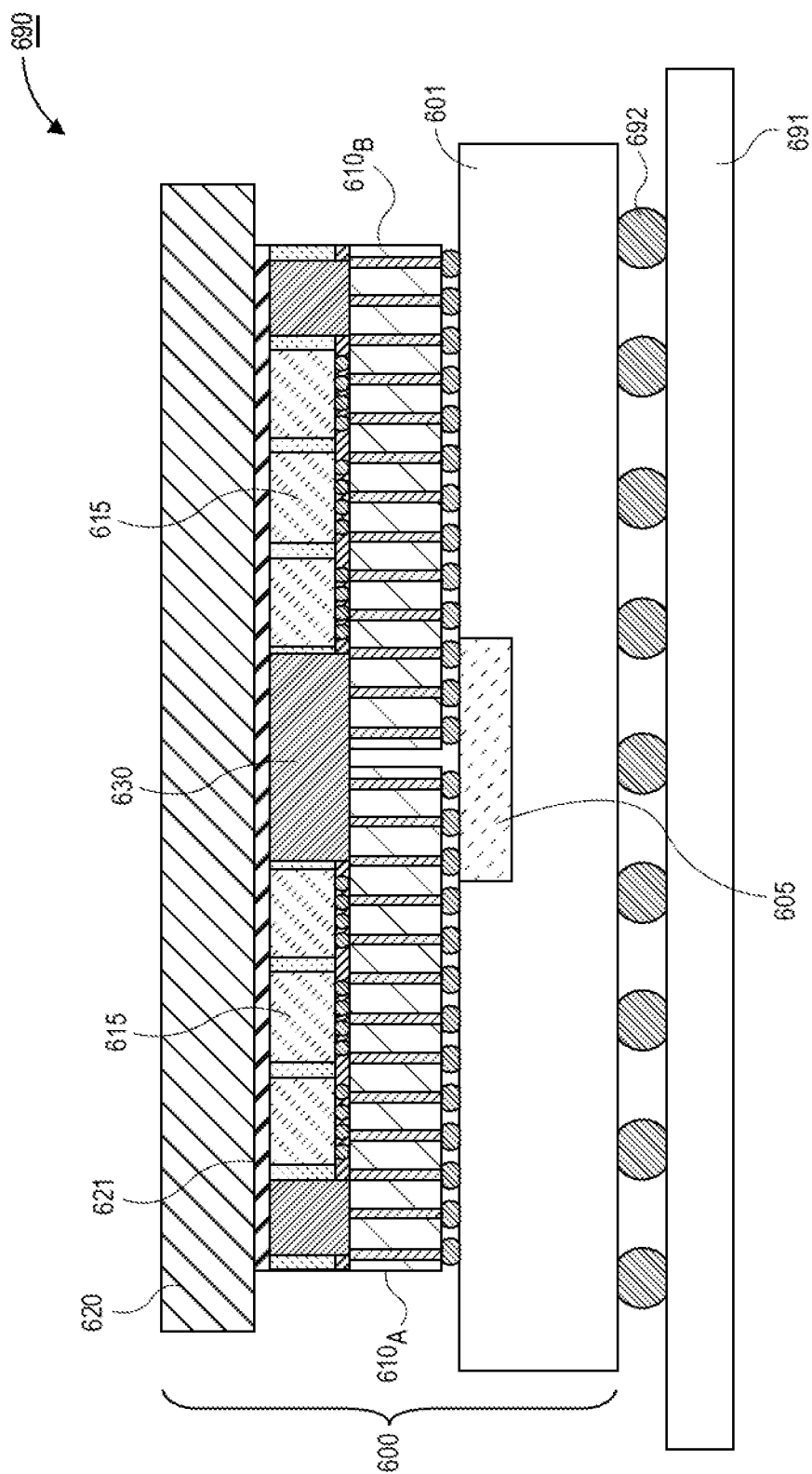
FIG. 6 is a cross-sectional illustration of an electronic system with TEC dies over the edge of base dies, in accordance with an embodiment.

Referring now to FIG. 6, a cross-sectional illustration of an electronic system 690 is shown, in accordance with an embodiment. The electronic system 690 may comprise a board 691, such as a printed circuit board (PCB). The board 691 may be coupled to an electronic package 600 by interconnects 692. The interconnects 692 are shown as solder balls, but it is to be appreciated that the interconnects 692 may be any interconnect architecture, such as sockets or the like.

In an embodiment, the electronic package 600 may be substantially similar to any of the electronic packages 200/

300 described above. For example, an electronic package 600 similar to the electronic package 200 in FIG. 2A is shown in FIG. 6. In an embodiment, the electronic package 600 comprises a package substrate 601 with an embedded bridge 605. A pair of base dies $610_A$ and $610_B$ are provided over the package substrate. Compute dies 615 are provided over the base dies $610_A$ and $610_B$. In an embodiment, TEC dies 630 are provided over edges of the base dies $610_A$ and $610_B$ in order to mitigate the formation of hotspots on the base dies $610_A$ and $610_B$. An IHS 620 that is thermally coupled to the compute dies 615 and the TEC dies 630 (via a TIM 621) is also provided in FIG. 6.

Figure 7:
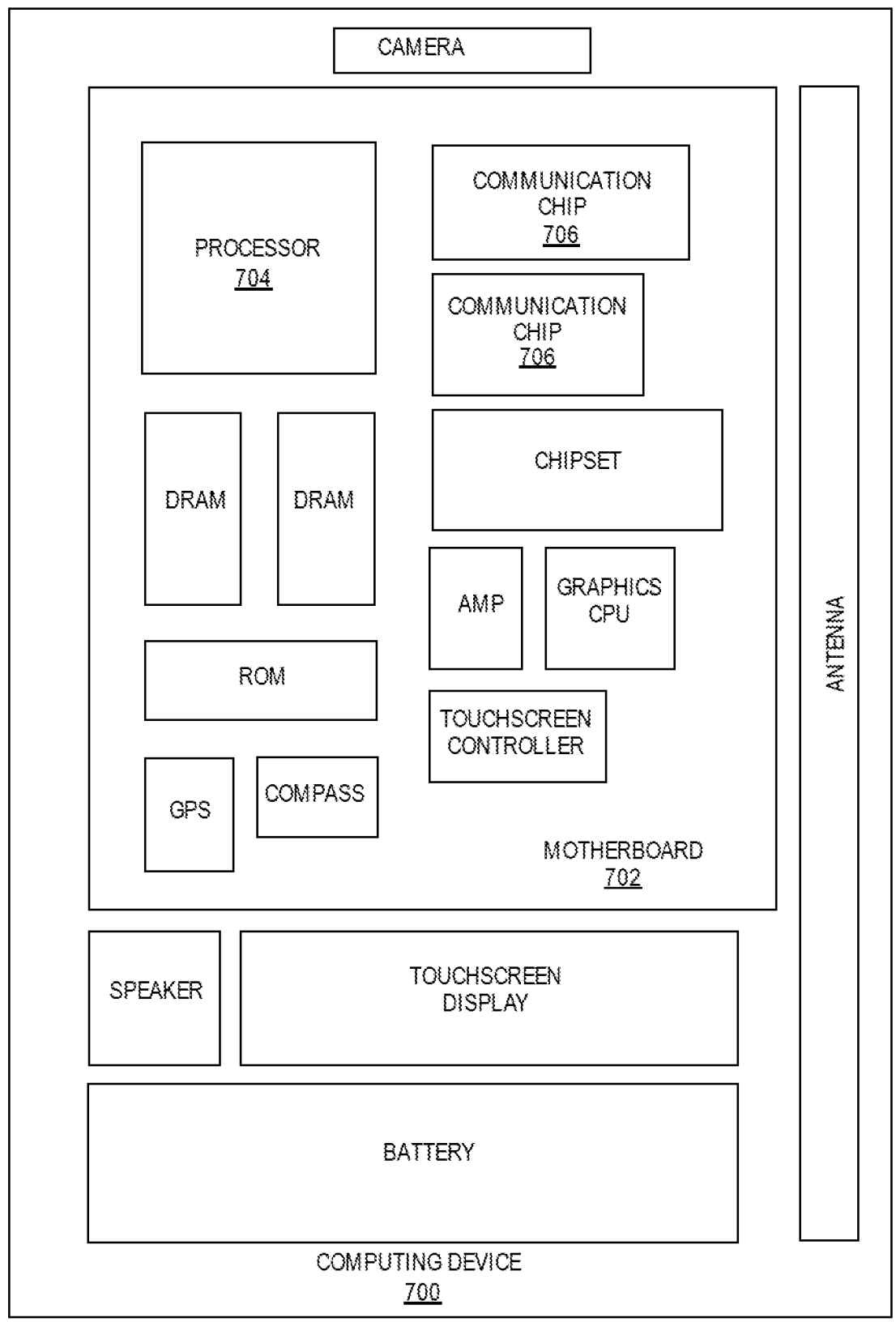
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of a multi-chip package that comprises one or more TEC dies to mitigate hotspots on various surfaces of the multi-chip package, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of a multi-chip package that comprises one or more TEC dies to mitigate hotspots on various surfaces of the multi-chip package, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a thermoelectric cooling (TEC) die, comprising: a glass substrate; an array of N-type semiconductor vias and P-type semiconductor vias through the glass substrate; and conductive traces over the glass substrate, wherein individual ones of the conductive traces connect an individual one of the N-type semiconductor vias to an individual one of the P-type semiconductor vias.

Example 2: the TEC die of Example 1, wherein the array comprises alternating the N-type semiconductor vias and the P-type semiconductor vias.

Example 3: the TEC die of Example 2, wherein the array is a four-by-four array, wherein two N-type semiconductor vias are in each row, and wherein two N-type semiconductor vias are in each column.

Example 4: the TEC die of Examples 1-3, wherein the conductive traces are over a first surface of the glass substrate and a second surface of the glass substrate opposite from the first surface.

Example 5: the TEC die of Example 4, wherein the conductive traces electrically couple the P-type semiconductor vias and the N-type semiconductor vias in a serpentine pattern.

Example 6: the TEC die of Example 5, wherein the conductive traces over the first surface of the glass substrate extend in a first direction or a second direction, and wherein the conductive traces over the second surface of the glass substrate extend in only the second direction.

Example 7: the TEC die of Examples 1-6, further comprising: a first heat spreader over a first surface of the glass substrate; and a second heat spreader over a second surface of the glass substrate opposite from the first surface.

Example 8: the TEC die of Example 7, wherein the first heat spreader and the second heat spreader comprise silicon.

Example 9: the TEC die of Examples 1-8, wherein the P-type semiconductor vias comprise antimony and tellurium, and wherein the N-type semiconductor vias comprise bismuth and tellurium.

Example 10: the TEC die of Examples 1-9, wherein the conductive traces are recessed into the glass substrate so that a surface of the conductive traces are substantially coplanar with a surface of the glass substrate.

Example 11: an electronic package, comprising: a package substrate; a first base die over the package substrate; a second base die over the package substrate; a plurality of compute dies over the first base die and the second base die; a thermoelectric cooling (TEC) die over the first base die and the second base die; and an integrated heat spreader (IHS) thermally coupled to the plurality of compute dies and the TEC die.

Example 12: the electronic package of Example 11, further comprising: a bridge die embedded in the package substrate, wherein the bridge die communicatively couples the first base die to the second base die.

Example 13: the electronic package of Examples 11-12, further comprising: a second TEC die over the first base die, wherein the second TEC die is adjacent to an edge of the first base die opposite from the TEC die; and a third TEC die over the second base die, wherein the third TEC die is adjacent to an edge of the second base die opposite from the TEC die.

Example 14: the electronic package of Examples 11-13, wherein the IHS comprises a recess, and wherein the TEC die extends into the recess.

Example 15: the electronic package of Examples 11-14, wherein the TEC die comprises: a glass substrate; an array of N-type semiconductor vias and P-type semiconductor vias through the glass substrate; and conductive traces over the glass substrate, wherein individual ones of the conductive traces connect an individual one of the N-type semiconductor vias to an individual one of the P-type semiconductor vias.

Example 16: the electronic package of Example 15, wherein the TEC die further comprises: a first heat spreader over a top surface of the glass substrate; and a second heat spreader over a bottom surface of the glass substrate.

Example 17: an electronic package, comprising: a package substrate; a first die over the package substrate, wherein the first die has a first thickness; a second die over the package substrate, wherein the second die has a second thickness that is less than the first thickness; and an integrated heat spreader (IHS) over the package substrate, wherein the first die is thermally coupled to the IHS by a first thermal interface material (TIM), and wherein the second die is thermally coupled to the IHS by a second TIM and a thermoelectric cooler (TEC) die.

Example 18: the electronic package of Example 17, wherein the first die is a compute die, and wherein the second die is a photonics die, and wherein the first die is communicatively coupled to the second die through the package substrate.

Example 19: the electronic package of Example 18, further comprising: an optical interconnect passing through the IHS and coupled to the second die.

Example 20: the electronic package of Examples 17-19, wherein the TEC die comprises: a glass substrate; an array of N-type semiconductor vias and P-type semiconductor vias through the glass substrate; and conductive traces over the glass substrate, wherein individual ones of the conductive traces connect an individual one of the N-type semiconductor vias to an individual one of the P-type semiconductor vias.

Example 21: the electronic package of claim 20, wherein the TEC die further comprises: a first heat spreader over a first surface of the glass substrate; and a second heat spreader over a second surface of the glass substrate opposite from the first surface.

Example 22: the electronic package of Example 21, wherein the first heat spreader and the second heat spreader comprise silicon.

Example 23: the electronic package of Examples 20-22, wherein the P-type semiconductor vias comprise antimony and tellurium, and wherein the N-type semiconductor vias comprise bismuth and tellurium.

Example 24: an electronic system, comprising: a board; a package substrate coupled to the board; a base die over the package substrate; a compute die over the base die; and a thermoelectric cooler (TEC) die over the compute die, wherein the TEC die comprises: a glass substrate; an array of N-type semiconductor vias and P-type semiconductor vias through the glass substrate; and conductive traces over the glass substrate, wherein individual ones of the conductive traces connect an individual one of the N-type semiconductor vias to an individual one of the P-type semiconductor vias.

Example 25: the electronic system of Example 24, wherein the conductive traces are over a first surface of the glass substrate and a second surface of the glass substrate opposite from the first surface, and wherein the conductive traces electrically couple the P-type semiconductor vias and the N-type semiconductor vias in a serpentine pattern.

What is claimed is:

1. A package, comprising:
    a base die;
    a compute die over the base die; and
    a thermoelectric cooling (TEC) die above and vertically overlapping with the base die, the TEC die laterally spaced apart from the compute die, the TEC die having an uppermost surface at a same level as an uppermost surface of the compute die, and the TEC die comprising:
    a glass substrate;
    an array of N-type semiconductor vias and P-type semiconductor vias through the glass substrate; and
    conductive traces over the glass substrate, wherein individual ones of the conductive traces connect an individual one of the N-type semiconductor vias to an individual one of the P-type semiconductor vias.

2. The package of claim 1, wherein the array comprises alternating the N-type semiconductor vias and the P-type semiconductor vias.

3. The package of claim 2, wherein the array is a four-by-four array, wherein two N-type semiconductor vias are in each row, and wherein two N-type semiconductor vias are in each column.

4. The package of claim 1, wherein the conductive traces are over a first surface of the glass substrate and a second surface of the glass substrate opposite from the first surface.

5. The package of claim 4, wherein the conductive traces electrically couple the P-type semiconductor vias and the N-type semiconductor vias in a serpentine pattern.

6. The package of claim 5, wherein the conductive traces over the first surface of the glass substrate extend in a first direction or a second direction, and wherein the conductive traces over the second surface of the glass substrate extend in only the second direction.

7. The package of claim 1, further comprising:
    a first heat spreader over a first surface of the glass substrate; and
    a second heat spreader over a second surface of the glass substrate opposite from the first surface.

8. The package of claim 7, wherein the first heat spreader and the second heat spreader comprise silicon.

9. The package of claim 1, wherein the P-type semiconductor vias comprise antimony and tellurium, and wherein the N-type semiconductor vias comprise bismuth and tellurium.

10. The package of claim 1, wherein the conductive traces are recessed into the glass substrate so that a surface of the conductive traces are substantially coplanar with a surface of the glass substrate.

11. An electronic package, comprising:
a package substrate;
a first base die over the package substrate;
a second base die over the package substrate, the second base die laterally spaced apart from the first base die;
a plurality of compute dies over the first base die and the second base die;
a thermoelectric cooling (TEC) die above and vertically overlapping with the first base die and the second base die, the TEC die coupled to the first base die and the second base die, the TEC die having an uppermost surface at a same level as an uppermost surface of the compute die, and the TEC die laterally spaced apart from the plurality of compute dies; and
an integrated heat spreader (IHS) thermally coupled to the plurality of compute dies and the TEC die.

12. The electronic package of claim 11, further comprising:
a bridge die embedded in the package substrate, wherein the bridge die communicatively couples the first base die to the second base die.

13. The electronic package of claim 11, further comprising:
a second TEC die over the first base die, wherein the second TEC die is adjacent to an edge of the first base die opposite from the TEC die; and
a third TEC die over the second base die, wherein the third TEC die is adjacent to an edge of the second base die opposite from the TEC die.

14. The electronic package of claim 11, wherein the IHS comprises a recess, and wherein the TEC die extends into the recess.

15. The electronic package of claim 11, wherein the TEC die comprises:
a glass substrate;
an array of N-type semiconductor vias and P-type semiconductor vias through the glass substrate; and
conductive traces over the glass substrate, wherein individual ones of the conductive traces connect an individual one of the N-type semiconductor vias to an individual one of the P-type semiconductor vias.

16. The electronic package of claim 15, wherein the TEC die further comprises:
a first heat spreader over a top surface of the glass substrate; and
a second heat spreader over a bottom surface of the glass substrate.

17. An electronic package, comprising:
a package substrate;
a first die over the package substrate, wherein the first die has a first thickness;
a second die over the package substrate, wherein the second die has a second thickness that is less than the first thickness; and
an integrated heat spreader (IHS) over the package substrate, wherein the first die is thermally coupled to the IHS by a first thermal interface material (TIM), and wherein the second die is thermally coupled to the IHS by a second TIM and a thermoelectric cooler (TEC) die, wherein the TEC die is laterally spaced apart from the first die, the TEC die having an uppermost surface at a same level as an uppermost surface of the first die, and wherein the TEC die is above and vertically overlapping with the second die.

18. The electronic package of claim 17, wherein the first die is a compute die, and wherein the second die is a photonics die, and wherein the first die is communicatively coupled to the second die through the package substrate.

19. The electronic package of claim 18, further comprising:
an optical interconnect passing through the IHS and coupled to the second die.

20. The electronic package of claim 17, wherein the TEC die comprises:
a glass substrate;
an array of N-type semiconductor vias and P-type semiconductor vias through the glass substrate; and
conductive traces over the glass substrate, wherein individual ones of the conductive traces connect an individual one of the N-type semiconductor vias to an individual one of the P-type semiconductor vias.

21. The electronic package of claim 20, wherein the TEC die further comprises:
a first heat spreader over a first surface of the glass substrate; and
a second heat spreader over a second surface of the glass substrate opposite from the first surface.

22. The electronic package of claim 21, wherein the first heat spreader and the second heat spreader comprise silicon.

23. The electronic package of claim 20, wherein the P-type semiconductor vias comprise antimony and tellurium, and wherein the N-type semiconductor vias comprise bismuth and tellurium.

24. An electronic system, comprising:
a board;
a package substrate coupled to the board;
a base die over the package substrate;
a compute die over the base die; and
a thermoelectric cooler (TEC) die above and vertically overlapping with the base die, the TEC die having an uppermost surface at a same level as an uppermost surface of the compute die, and the TEC die laterally spaced apart from the compute die, wherein the TEC die comprises:
a glass substrate;
an array of N-type semiconductor vias and P-type semiconductor vias through the glass substrate; and
conductive traces over the glass substrate, wherein individual ones of the conductive traces connect an individual one of the N-type semiconductor vias to an individual one of the P-type semiconductor vias.

25. The electronic system of claim 24, wherein the conductive traces are over a first surface of the glass substrate and a second surface of the glass substrate opposite from the first surface, and wherein the conductive traces electrically couple the P-type semiconductor vias and the N-type semiconductor vias in a serpentine pattern.

* * * * *